United States Patent
Seo et al.

(10) Patent No.: US 7,682,778 B2
(45) Date of Patent: Mar. 23, 2010

(54) METHODS OF FORMING CONTACT PLUGS IN SEMICONDUCTOR DEVICES

(75) Inventors: Jung-Woo Seo, Suwon-si (KR); Tae-Hyuk Ahn, Yonin-si (KR); Jong-Seo Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1025 days.

(21) Appl. No.: 11/342,560

(22) Filed: Jan. 31, 2006

(65) Prior Publication Data

US 2006/0222966 A1    Oct. 5, 2006

(30) Foreign Application Priority Data

Apr. 1, 2005    (KR) ...................... 10-2005-0027566

(51) Int. Cl.
*G03F 7/16* (2006.01)
*G03F 7/40* (2006.01)
*H01L 21/027* (2006.01)
*H01L 21/441* (2006.01)
*H01L 21/3205* (2006.01)
*H01L 21/4763* (2006.01)

(52) U.S. Cl. ........................ 430/314; 430/319; 438/478; 438/586; 438/672

(58) Field of Classification Search .................. 430/314; 438/478

See application file for complete search history.

(56) References Cited

U.S. PATENT DOCUMENTS 6,593,235 B2 *  7/2003  Uochi et al. ................. 438/673
2002/0006734 A1 *  1/2002  Imai et al. .................... 438/735

FOREIGN PATENT DOCUMENTS

| JP | 2001-185701 | 7/2001 |
| KR | 10-2000-0051298 | 8/2000 |
| KR | 10-2003-0002269 | 1/2003 |

* cited by examiner

*Primary Examiner*—Mark F Huff
*Assistant Examiner*—John Ruggles
(74) *Attorney, Agent, or Firm*—Harness, Dickey & Pierce, PLC

(57) ABSTRACT

Provided are contact photomasks and methods using such photomasks for fabricating semiconductor devices and forming contact plugs on portions of active regions exposed between gate lines. The elongated active regions are arrayed in a series of parallel groups with each group being, in turn, aligned along their longitudinal axes to form an acute angle with the gate lines. The contact photomask includes a plurality of openings arranged in parallel lines that are aligned at an angle offset from previously formed gate lines and which may be parallel to the active regions or may be aligned at an angle offset from the axes of both the groups of active regions and the gate lines. Processes for forming contact plugs using such photomasks may provide increased processing margin and extend the utility of conventional exposure equipment for semiconductor devices exhibiting increased integration density and/or built to more demanding design rules.

11 Claims, 19 Drawing Sheets

METHODS OF FORMING CONTACT PLUGS IN SEMICONDUCTOR DEVICES

PRIORITY STATEMENT

This application claims priority under 35 U.S.C. § 119 from Korean Patent Application No. 10-2005-0027566, filed on Apr. 1, 2005, in the Korean Intellectual Property Office, the disclosure of which is incorporated herein, in its entirety, by reference.

BACKGROUND OF THE INVENTION

1. Field of the Invention

Example embodiments of the invention are directed to photomask configurations and methods utilizing such photomasks in fabricating semiconductor devices and, more particularly, to photomask configurations utilized in forming contact openings during the fabrication of semiconductor devices and methods of forming contact openings using such photomasks.

2. Description of the Related Art

As semiconductor devices have become more highly integrated, the critical process dimensions, for example, the spacing between adjacent conductive lines, are being reduced accordingly. The increased degree of integration has led to other changes in the fabrication process as well including, for example, delaying formation of capacitor structures until after formation of the bit lines in semiconductor memory devices such as DRAMs to provide additional surface area for capacitor formation. The semiconductor device fabrication process also typically includes the formation of contact plugs for establishing electrical connection between, for example, conductive regions provided in the semiconductor substrate and upper structures, for example, bit lines and/or capacitor electrodes.

FIG. 1A and FIG. 2A are plan views illustrating a conventional method for forming such contact plugs. FIG. 1B and FIG. 2B are cross-sectional views taken along a portion of the line B-B on FIG. 1A and FIG. 2A respectively, the illustrated portion generally corresponding to a single active region. As illustrated in FIGS. 1A and 1B, a plurality of elongated active regions 14 are formed in a semiconductor substrate 10 and aligned along their major axis to form a plurality of lines paralleling a first axis A. The active regions 14 are electrically isolated from adjacent active regions using an isolation layer 12. A plurality of gate lines 16 paralleling a second axis G are then formed over the active regions 14. The axes A and G are not perpendicular and accordingly intersect to form complementary pairs of acute and obtuse angles.

The gate lines 16 may have a stack structure including a gate insulator (not shown), a gate electrode 17, for example polysilicon, an additional low resistance conductor 18, such as a polycide or salicide, for improving the electrical conductivity of the gate electrode, and a capping pattern 19, typically formed from an insulating material, as a protecting layer. Insulating spacers 20 may also be formed on the sidewalls of the gate lines 16 and may have single or multilayer construction. An interlayer insulating layer 22 may also be provided over the gate lines 16 for controlling the depth of the subsequently formed contact plug and improving the associated photolithographic process.

Contact holes 24 are formed through the insulating materials to expose portions of the active regions 14 between the gate lines 16 and provide an opening for the formation of contact plugs that will be utilized for electrically connecting the active regions to, for example, a bit line or a lower electrode of a capacitor. The contact hole 24 is typically formed using a photomask having a plurality of generally circular transparent windows (hereinafter, referred to as a "hole pattern"). An interlayer insulating layer 22 may be utilized for improving the planarity of the substrate before patterning by deposing the interlayer insulating layer on the semiconductor substrate 10 to cover the gate lines 16. An upper portion of the interlayer insulating layer 22 may then be removed using a CMP, etchback or equivalent process to form a planarized surface. The amount of the interlayer insulating layer removed may result in an upper surface of the capping pattern 19 (if present) or the gate line 16 being exposed or may continue to completely encapsulate the gate lines 16.

A photoresist layer (not shown) is then formed on the surface of the planarized interlayer insulating layer 22 and exposed using a photomask having the hole pattern. The exposed photoresist is then developed to form a photoresist pattern exposing those regions of the semiconductor substrate in which contact holes will be formed. Using the photoresist pattern as an etch mask, portions of the remaining interlayer insulating layer 22 are removed to expose portions of the active regions 14. Depending on the particular configuration of the gate lines 16, the materials utilized, the etch processes and the critical spacings, the contact hole etch may also remove portions of the insulating spacer 20 (if present), the capping pattern 19 (if present) and/or the gate line 16.

As illustrated in FIGS. 2A and 2B, the photoresist pattern is then removed and a conductive material layer, for example, tungsten (W), is deposited on the semiconductor substrate to fill the contact holes 24. An upper portion of the conductive material layer is then removed to expose an upper surface of the interlayer insulating layer 22 and thereby separating those portions of the conductive material layer remaining in the contact holes and thereby forming contact plugs 26, 28. As illustrated in FIGS. 2A and 2B, the contact plugs include both a bit line contact plug 26, i.e., a plug that will subsequently be connected to a bit line, and lower electrode contact plugs 28, i.e., plugs that will subsequently be connected to the lower electrode of a capacitor.

As the distance between the gate lines 16 of a highly integrated semiconductor device is reduced, the exposed portions of the active regions 14, for example, a diagonal-shaped portion of the active region (hereinafter, referred to as "active region") is also reduced. In order to form the contact hole 24 between the narrowly spaced gate lines 16, a photolithography process must be performed using a light source having a relatively short wavelength, for example, that provided by an ArF light source. In comparing equipment utilizing light sources that can provide the same wavelength, another consideration is the numerical aperture provided by exposure equipment with higher numerical apertures, for example, at least about 0.93, generally being utilized for patterning smaller critical dimensions. However, equipment having both light source capable of producing short wavelength light or providing a higher numerical aperture will tend to be much more expensive than conventional equipment and may also provide lower throughput, thereby further increasing the cost per exposure. Accordingly, the patterning improvements provided by such exposure equipment may be difficult to justify for high volume production requirements.

As the distance between the gate lines 16 is reduced, the likelihood and, if present, the severity of etch striation phenomenon within the contact hole 24 will tend to become more severe. In order to suppress this striation phenomenon, the method of fabricating the contact hole may be modified to include a polymer hard photomask and/or an additional hard photomask of silicon nitride formed on the surface of the interlayer insulating layer 22.

SUMMARY OF THE INVENTION

Example embodiments of the invention are directed to a photomask configuration useful for forming contact openings on highly integrated semiconductor devices without requiring the use of a separate hard photomask and using a exposure apparatus that utilizes only conventional light sources and/or is capable of providing only a conventional numerical aperture.

Example embodiments of the invention are also directed to methods for using such photomasks in forming contact openings and the corresponding contact plugs without requiring the use of a separate hard photomask and while using a conventional light source and exposure equipment capable of providing only a conventional numerical aperture.

According to an example embodiment of the invention, a photomask may be configured to include a photomask substrate and a first photomask window formed on the photomask substrate wherein the first photomask window will expose a plurality of elongated active regions on a semiconductor substrate, the active regions being aligned parallel to a first axis direction A in a semiconductor substrate. The first direction extends to form an acute angle with a gate line axis G extending along a second direction on the semiconductor substrate.

The first photomask window may be configured whereby a plurality of transparent windows are aligned along the first direction A while maintaining a separation distance between adjacent transparent windows so that the first photomask windows do not overlap each other and, or do not, completely overlap the previously formed active regions. Alternatively, the first photomask windows may be configured as a plurality of parallel stripes whereby all of the active regions aligned along a single axis and the portions of the isolation regions separating adjacent active regions are exposed.

According to another example embodiment of a method according to the invention, forming a contact plug includes forming a plurality of active regions aligned parallel to a first axis A extending along a first direction in a semiconductor substrate; forming gate lines, which may be regularly spaced, aligned parallel to a second axis G extending along a second direction, wherein the first and second axes form an acute angle α. A contact plug may then be formed on those portions of the active regions exposed between the gate lines using a photomask having a transparent first photomask window configured to expose a plurality of active regions aligned along the first axis A.

The gate line may have a stacked a structure including a gate dielectric, a first conductive layer, for example a polysilicon layer, a second conductive layer, for example a silicide layer, and a capping layer, for example an insulating layer, which are sequentially stacked. The gate line may also include an insulating spacer formed on sidewalls of the gate lines and formed of one or more insulating materials. An interlayer insulating layer may be formed over the gate lines and subsequently planarized.

The contact plugs may be formed by forming a photoresist layer on the planarized surface of the interlayer insulating oxide and then exposing the photoresist layer through a first photomask window and developing the exposed photoresist layer to form a photoresist pattern exposing the plurality of active regions aligned along the first axis A and portions of the overlapping gate lines.

The exposed portions of the planarized interlayer insulating layer may then be removed using the photoresist pattern and the gate line as etch masks, thereby forming a contact hole that exposes a portion of the surface of the active region. The photoresist pattern may then be removed and a layer of conductive material formed on the substrate to fill the contact hole. An upper portion of the layer of conductive material may then be removed to expose an upper surface of the interlayer insulating layer and thereby separate the portions of the layer of conductive material filling the contact holes and form the contact pad.

During the formation of the contact holes, recess regions may be formed as an upper portion of the exposed portions of the gate lines is removed. In such instances, during the subsequent formation of the contact pads, in addition to removing the upper portion of the layer of conductive material, an additional thickness of the planarized interlayer insulating layer and an upper portion of the gate line may also be removed so that the top surface of the contact plug is established at or below a plane defined by the lower surfaces the recessed regions.

The contact plugs may be separated from the gate lines by insulating spacers formed on sidewalls of the gate lines and/or by remaining portions of the interlayer insulating layer. The contact plugs may have an angular shape and/or may fully cover the exposed portions of the active regions.

In accordance with another example embodiment of a method according to the invention, forming a contact plug includes forming a plurality of active regions aligned parallel to a first axis A extending along a first direction in a semiconductor substrate and forming a plurality of gate lines across the active regions, the gate lines being regularly spaced and aligned parallel to a second axis G extending along a second direction wherein the first and second axes form an acute angle α. Contact plugs may then be formed on the portions of the active regions exposed between the gate lines by using a photomask having stripe-shaped transparent second photomask windows aligned parallel to a third axis C extending along a third direction, the second and third axes forming an acute angle β, which may, in turn, be symmetrical to the angle α formed between the first axis A and the second axis G.

BRIEF DESCRIPTION OF THE DRAWINGS

The scope of the invention will become more apparent to those of ordinary skill in the art by referring to the detailed description of example embodiments provided below with reference to the attached drawings in which.

Figure 1A:
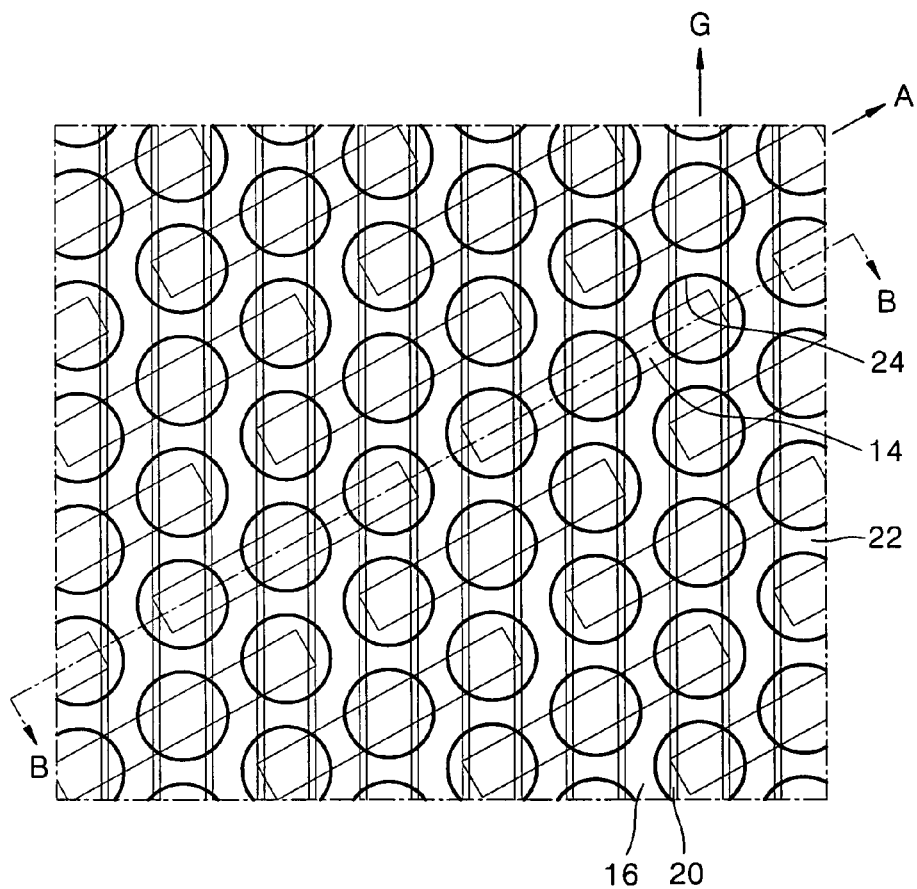
FIG. 1A and FIG. 2A are plan views illustrating a conventional method of forming a contact pad.
Figure 1B:
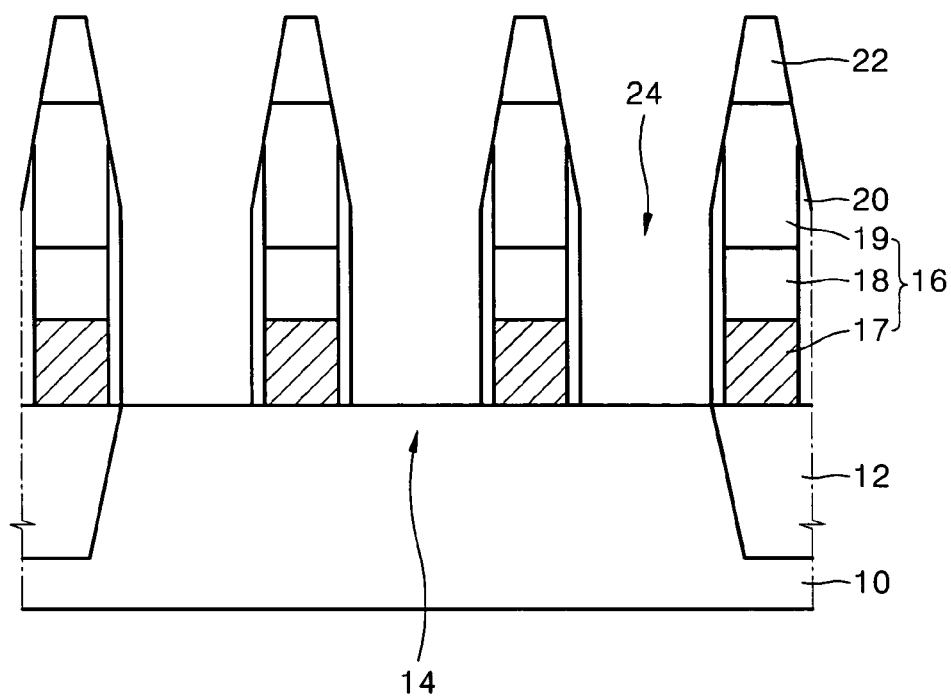
FIG. 1B and FIG. 2B are corresponding cross-sectional views taken along a line B-B of FIG. 1A and FIG. 2A respectively.
Figure 2A:
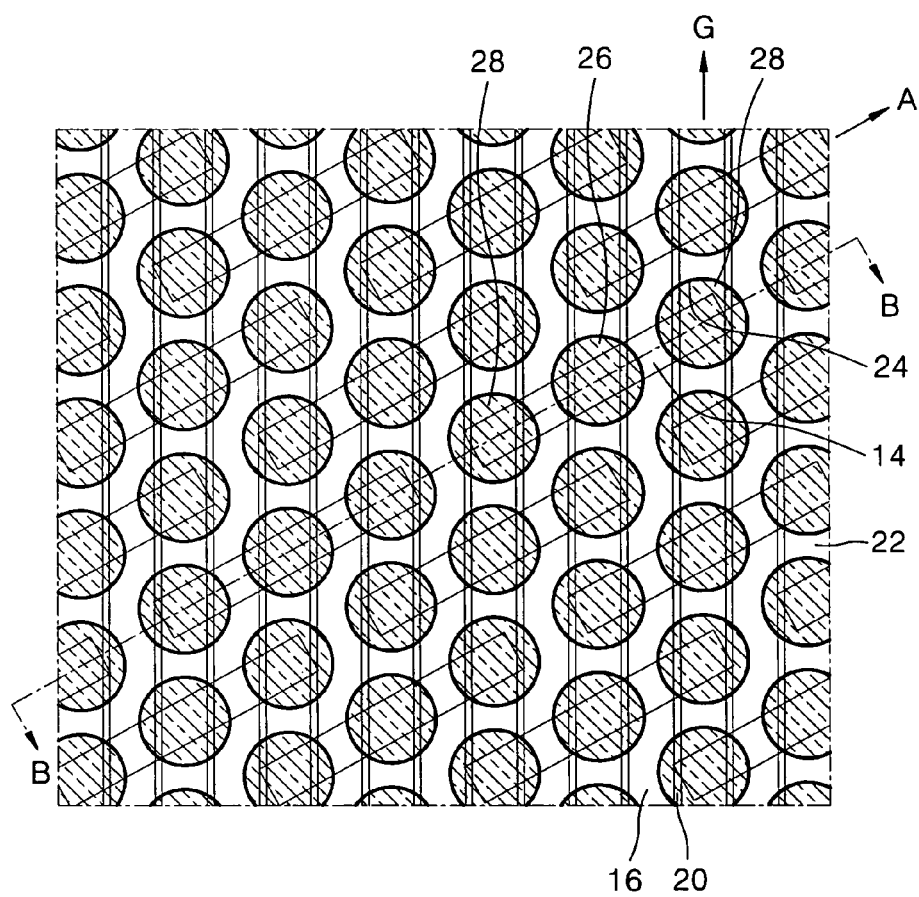
Figure 2B:
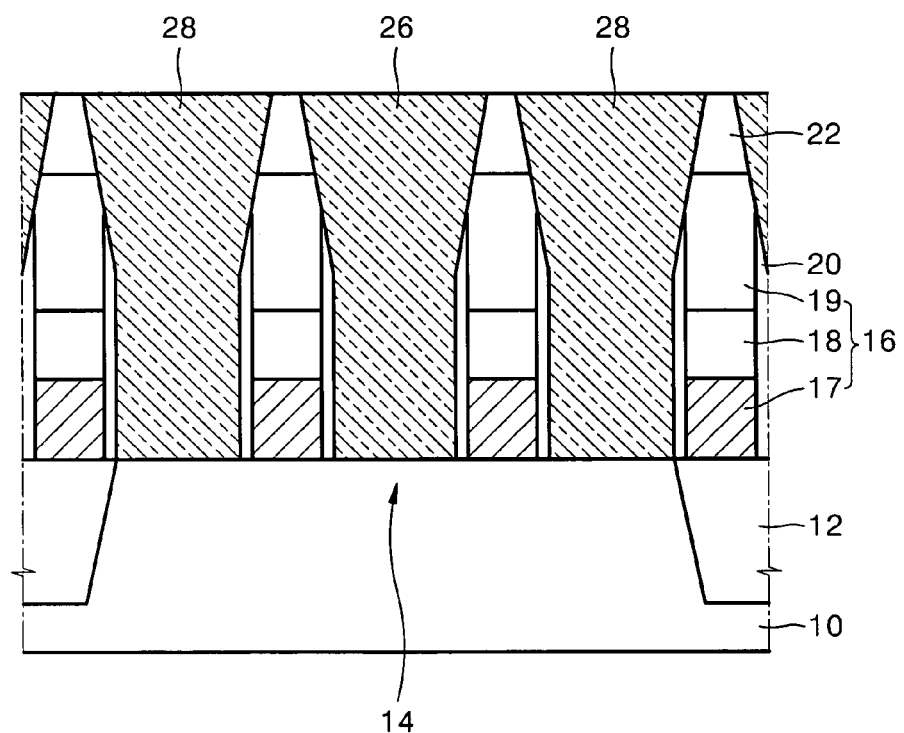

These drawings have been provided to assist in the understanding of the exemplary embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity.

Those of ordinary skill in the art will also appreciate that a range of alternative configurations have been omitted simply to improve the clarity and reduce the number of drawings. Those of ordinary skill will appreciate that certain of the various process steps illustrated or described with respect to the exemplary embodiments may be selectively and independently combined to create other methods useful for manufacturing semiconductor devices without departing from the scope and spirit of this disclosure.

DETAILED DESCRIPTION OF THE INVENTION

The present invention will now be described more fully hereinafter with reference to the accompanying drawings, in which certain example embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 3:
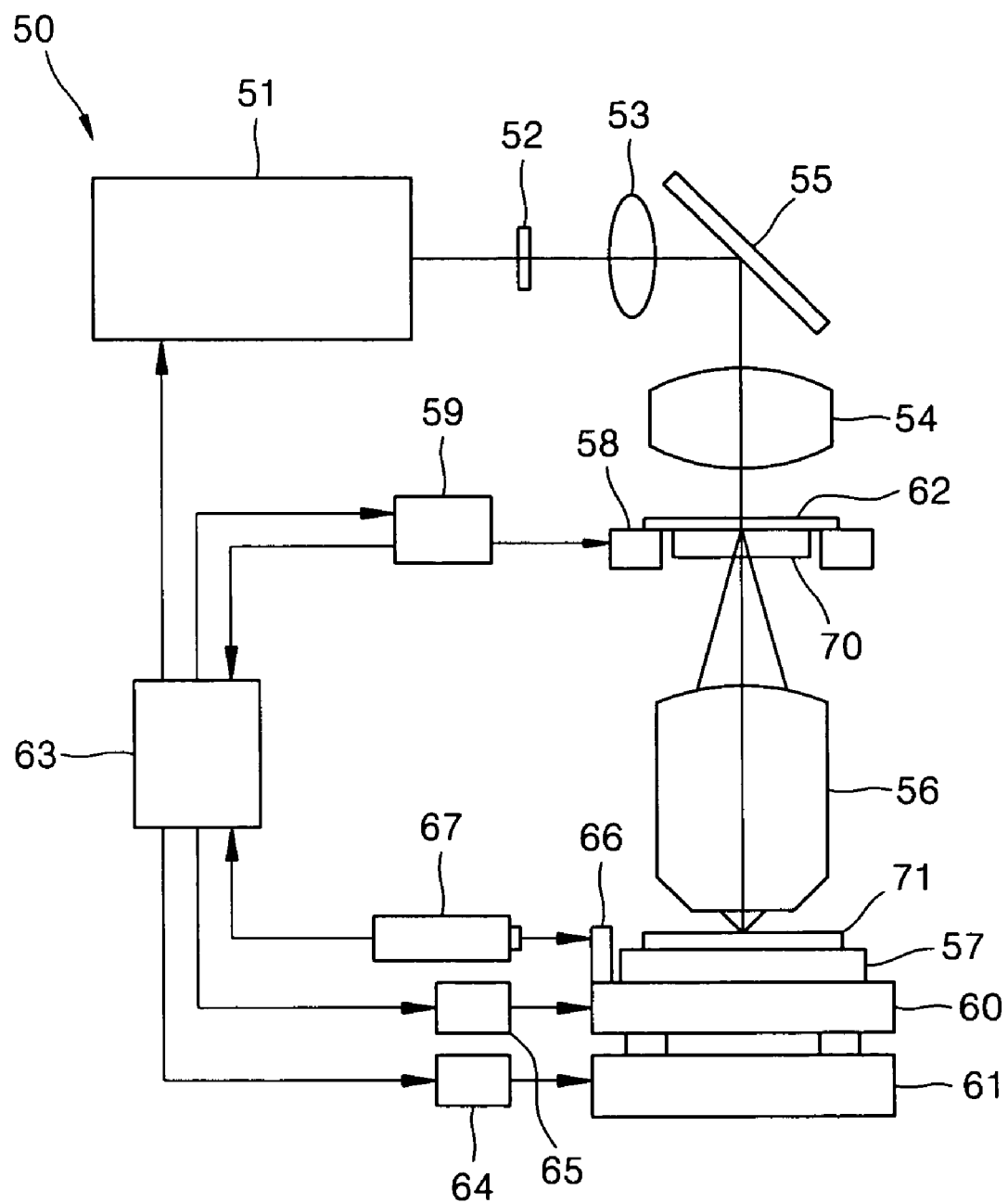
FIG. 3 is a view schematically illustrating an example of a reducing projection exposure apparatus that may be used for implementing the photolithography steps of the methods according to the example embodiments of the invention.

FIG. 3 is a schematic view illustrating an example embodiment of a reducing projection exposure apparatus 50 that may be for conducting the photolithography processes incorporated in the example embodiments of the present invention.

As illustrated in FIG. 3, the example embodiment of the reducing projection exposure apparatus 50 has 1/4 of reduction ratio, a KrF eximer laser light source (wavelength $\lambda$=0.248 μm), and exhibits a coherency σ of 0.3 or less and which may exhibit a coherency of 0.1 or less. Thus, the example reducing projection exposure apparatus 50 for practicing the example embodiments of the method according to the invention may be a scanner and may incorporate a projection lens having a numerical aperture on the order of 0.68.

As illustrated in FIG. 3, light emitted from light source 51 passes through a first lens 52, condenser lens 53, 54 and a mirror 55, and is irradiated on a photomask 62 to effect pattern transfer to a semiconductor substrate 71. Photomask 62 may include a photomask 200 (configured in accord with FIG. 4) for use in a method according to a first example embodiment of the invention and a photomask 300 (configured in accord with FIG. 10) for use in a method according to a second example embodiment of the invention. A pellicle 70 may be provided under the photomask 62 to prevent a failure of pattern transfer due to foreign substance attached to the photomask 62. The pattern formed on the photomask 62 is thereby reduced and transferred to a photoresist layer deposited on a semiconductor substrate 71 provided on a wafer holder 57 that may be repositioned under a projecting lens 56.

The photomask 62 may be positioned on a stage 58 such that a center of the photomask pattern is aligned with an optical axis of the projected lens 56.

Movement of the photomask stage 58 is controlled by a photomask location control unit 59. The wafer holder 57 is installed on an X-Y stage 61 that to move in an optical axis direction of the projected lens 56. The X-Y stage 61 is configured for moving the semiconductor substrate 71 in an X-axis direction and a Y-axis direction perpendicular to the optical axis. The wafer holder 57 is also supported by a Z stage configured for moving the semiconductor substrate 71 parallel to the optical axis. The X-Y stage 61 and a Z stage 60 are driven by drive units 65, 64 respectively in response to control demands from a control system 63 whereby the semiconductor substrate 71 can be moved between a plurality of predetermined exposure positions. The exposure position can be detected using a laser detector 67 for sensing the location of a mirror 66 fixed to the Z stage 60.

As noted above, example embodiments of the invention utilize different photomask patterns for forming the contact plugs. The photomasks used for practicing the example embodiments of the invention may utilize photomask windows having openings arranged symmetrically about the gate lines formed on the semiconductor substrates.

First Embodiment

Figure 4:
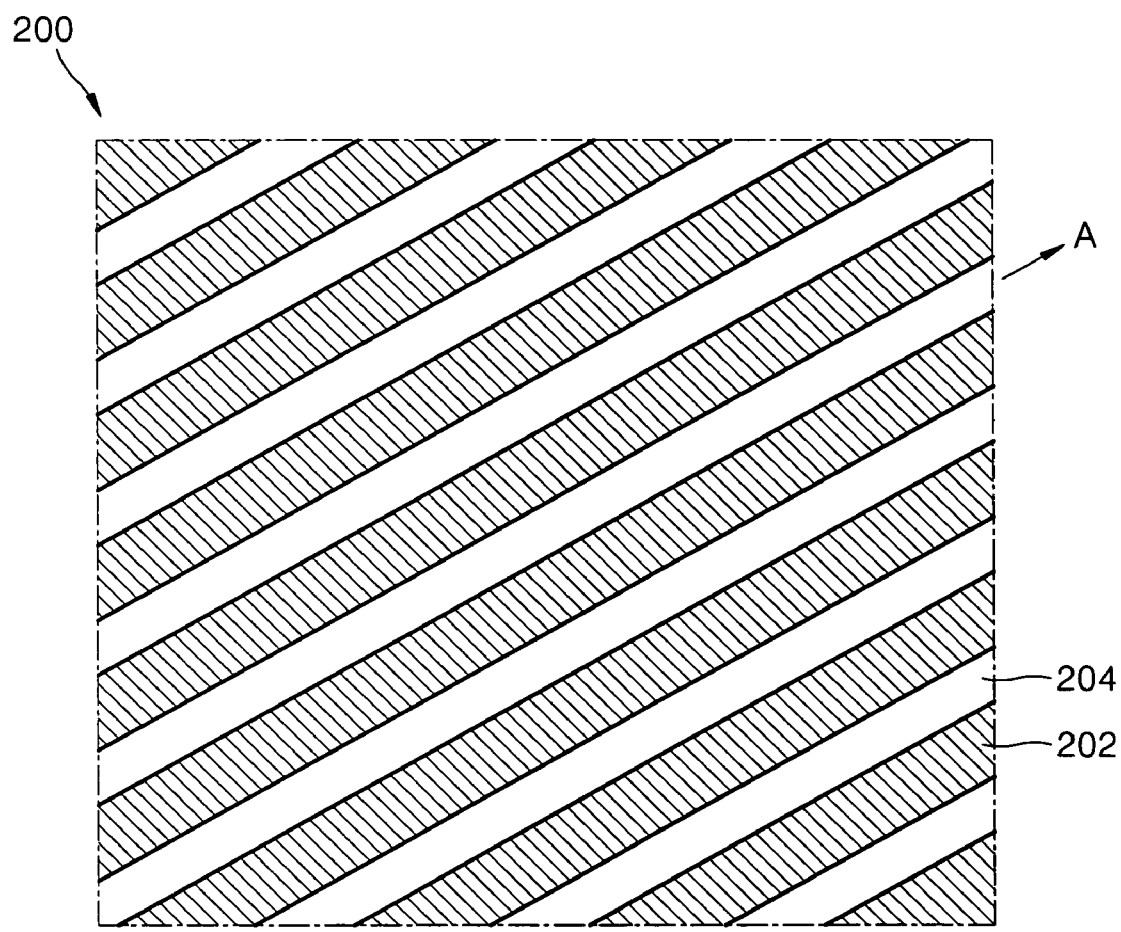
FIG. 4 is a plan view illustrating a photomask having a first photomask window according to first example embodiment of the invention.

FIG. 4 is a plan view illustrating a photomask 200 having a first photomask window 204 according to a first example embodiment of the invention. As illustrated in FIG. 4, a photomask 200 according to the first example embodiment of the present invention includes a substrate 202 for a photomask (hereinafter, referred to as "mask substrate") and the first photomask window 204. The first photomask window 204 is formed on the photomask substrate 202 and provides a stripe-shaped or linear transparent window or opening for exposing a plurality of active regions 104 (as shown in FIG. 5A) aligned parallel to a first axis A extending along a first direction on the semiconductor substrate 100 (FIG. 5A) that will form an acute angle α with the gates line 106 (as shown in FIG. 6A) that are aligned parallel to a second axis G extending along a second direction on the semiconductor substrate 100.

The photomask 200 may include a plurality of parallel stripe-shaped linear windows or openings 204 aligned along the A direction and separated from adjacent windows by regions 202 that will not transmit light. Further, the first photomask window 204 may be configured to extend across a plurality of aligned active regions provided in an active region array or may be interrupted (not shown) to separate the openings corresponding to the active region for a single memory cell.

The photomask substrate 202 is composed of a transparent material, for example quartz, with the first photomask window 204 is formed on one surface of the photomask substrate using a nontransparent material, for example chrome. Accordingly, the first photomask window 204 of the photomask 200 will transmit light from a light source while the remaining portions of the photomask will block the light, thereby shielding regions of the semiconductor substrate from exposure.

Figure 5A:
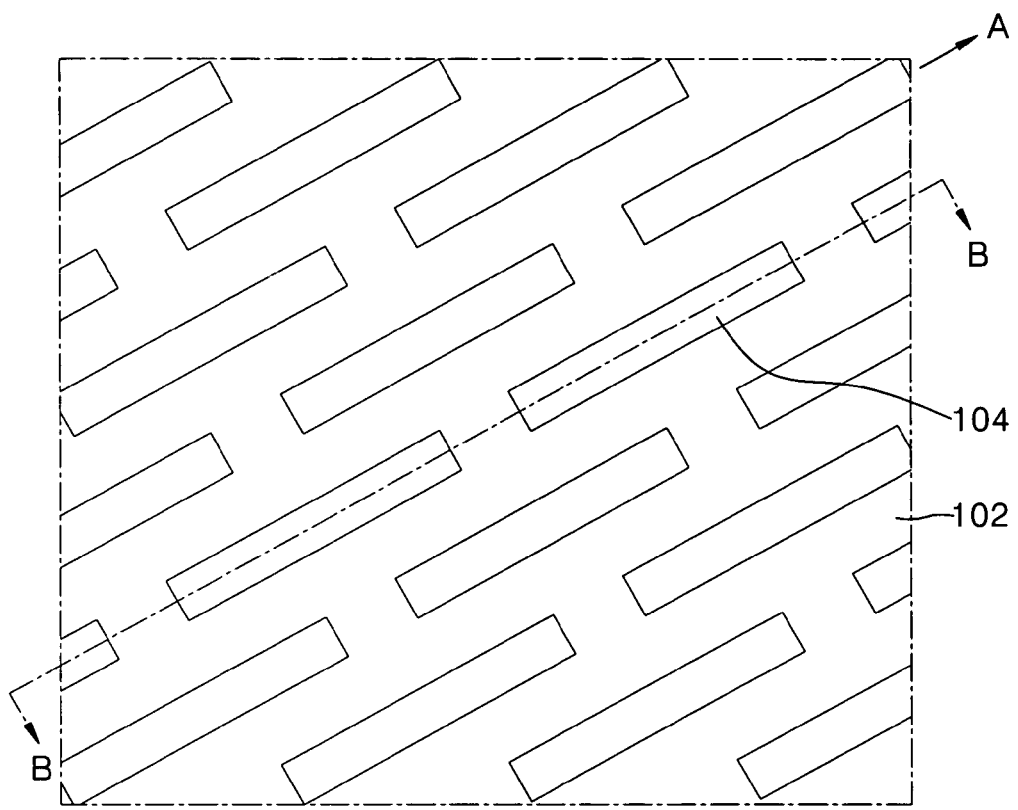
FIGS. 5A, 6A, 7A, 8A and 9A are plan views illustrating the formation of a contact plug according to a first example embodiment of the invention.

FIG. 5A through FIG. 9A are plan views illustrating a first example embodiment of a method of forming a contact plug according to the invention, and FIG. 5B through FIG. 9B are sectional views taken along a line of B-B of FIG. 5A. FIG. 8C is a sectional view taken along a line of C-C of FIG. 8A, and FIG. 8D is an enlarged perspective view illustrating a portion D of FIG. 8A.

Figure 5B:
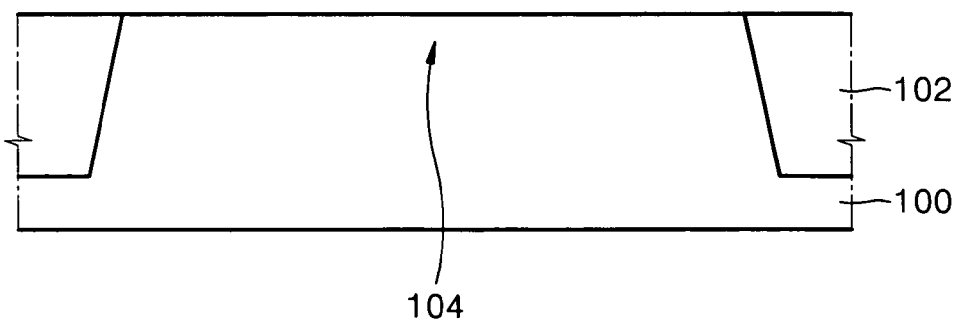
FIGS. 5B, 6B, 7B, 8B and 9B are corresponding cross-sectional views taken along the lines B-B as indicated on FIGS. 5A, 6A, 7A, 8A and 9A respectively.
Figure 6A:
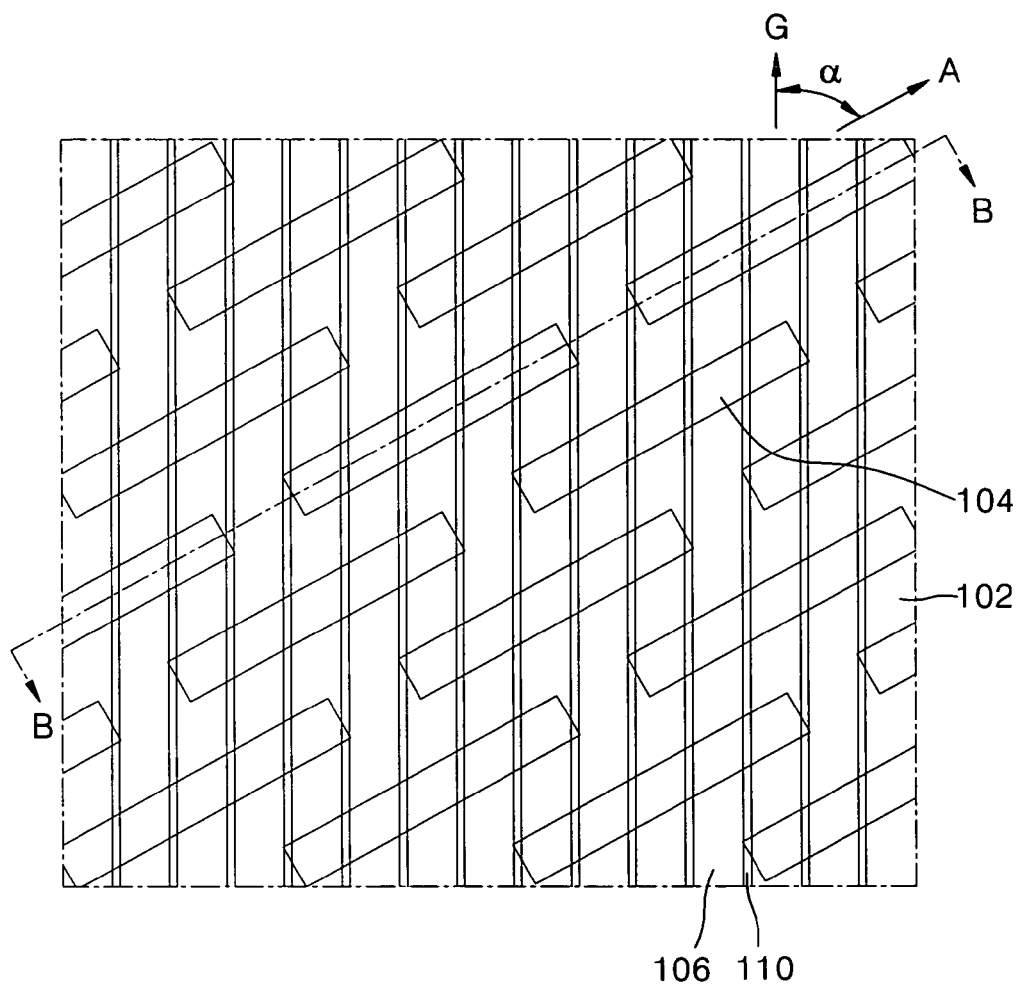

As illustrated in FIGS. 5A and 5B, a plurality of elongated active regions 104 are formed in a semiconductor substrate 100 and aligned parallel to a first axis A extending in a first direction generally corresponding to a longitudinal axis of the active regions 104. The active regions 104 are separated by an isolation layer pattern 102.

Figure 6B:
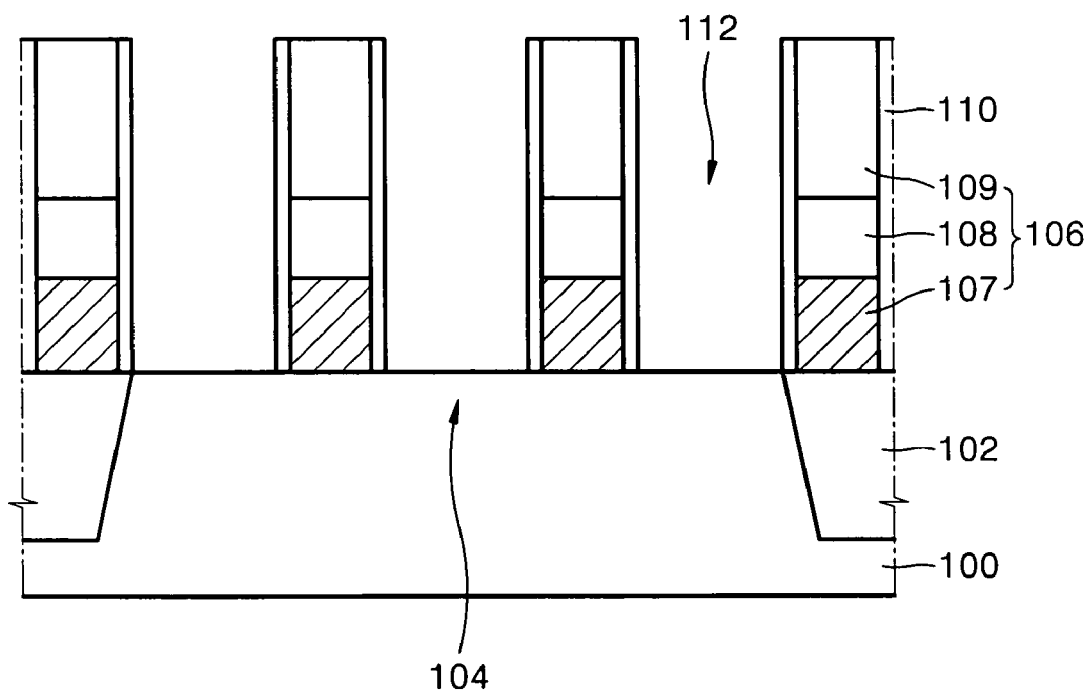

As illustrated in FIGS. 6A and 6B, a plurality of regularly spaced gate lines 106 are formed parallel to a second axis G extending along a second direction on the semiconductor substrate 100, the first and second axes forming an acute angle α. The gate line 106 may have a stacked structure including, for example, a gate dielectric (not shown), a first conductive layer 107, such as polysilicon layer, a second conductive layer 108, such as a silicide, and a capping layer 109, such as an insulating layer. In addition to polysilicon, the first conductive layer 107 may be formed from one or more layers of conductive materials selected from a group including, for example, amorphous polysilicon, poly-SiGe, metals and conductive metal compounds. The first conductive layer may be, for example, a combination of a metal nitride and a complementary metal or metal alloy, for example titanium nitride, tantalum nitride and/or tungsten nitride in combination with tungsten, molybdenum, titanium, tantalum and/or tungsten. In those instances in which the first conductive layer is sufficiently conductive, the second conductive layer 108 may be omitted from the gate line structure. The capping layer 109 may be composed of one or more materials, for example silicon nitride, that provide(s) a sufficient etch selectivity with respect to the interlayer insulating layer 114 deposited subsequently to protect the gate line during the contact etch.

The gate line 106 may also include an insulating spacer 110 formed on its sidewalls from one or more insulating materials. The insulating spacer 110 may be composed of one or more materials, for example silicon nitride, that provide(s) a sufficient etch selectivity with respect to an interlayer insulating layer 114 deposited subsequently to protect the sidewalls of the gate lines during the contact etch.

Figure 7A:
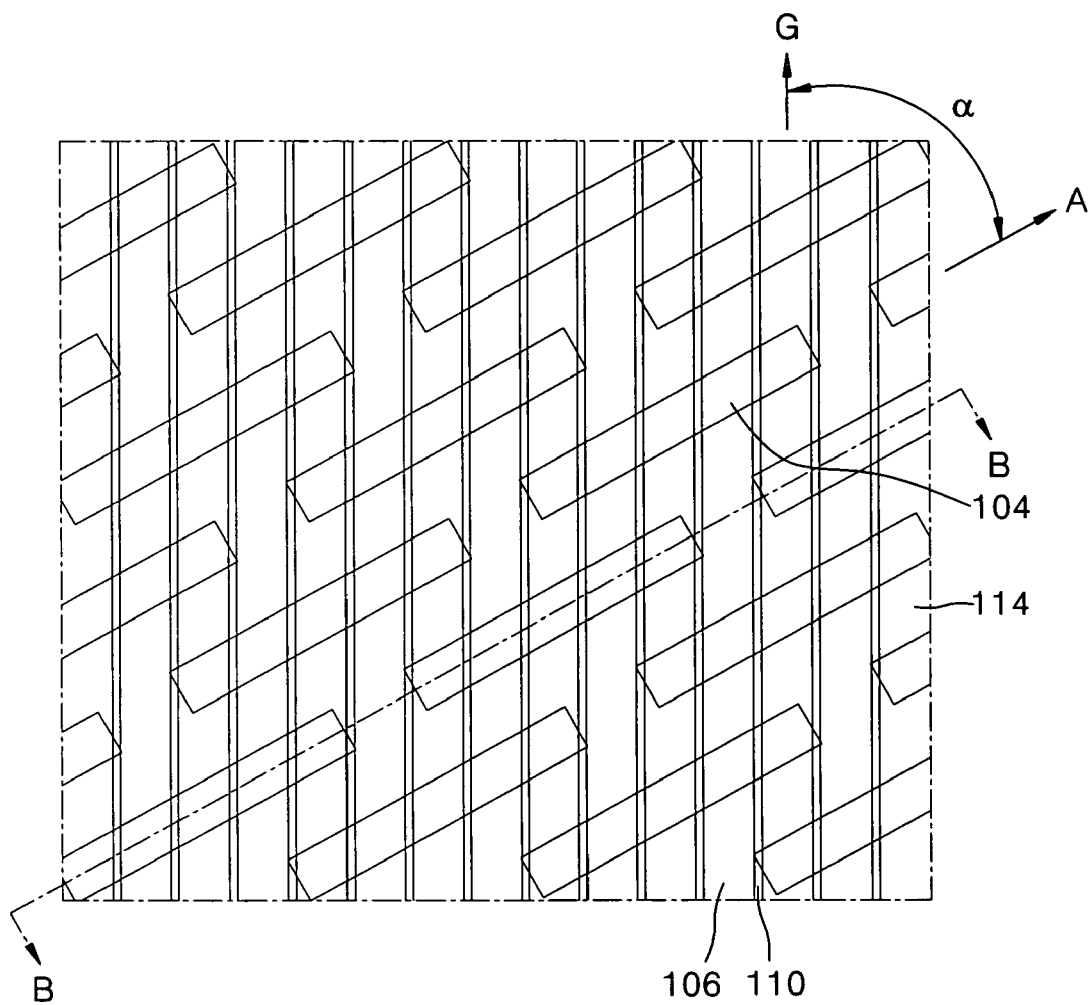
Figure 7B:
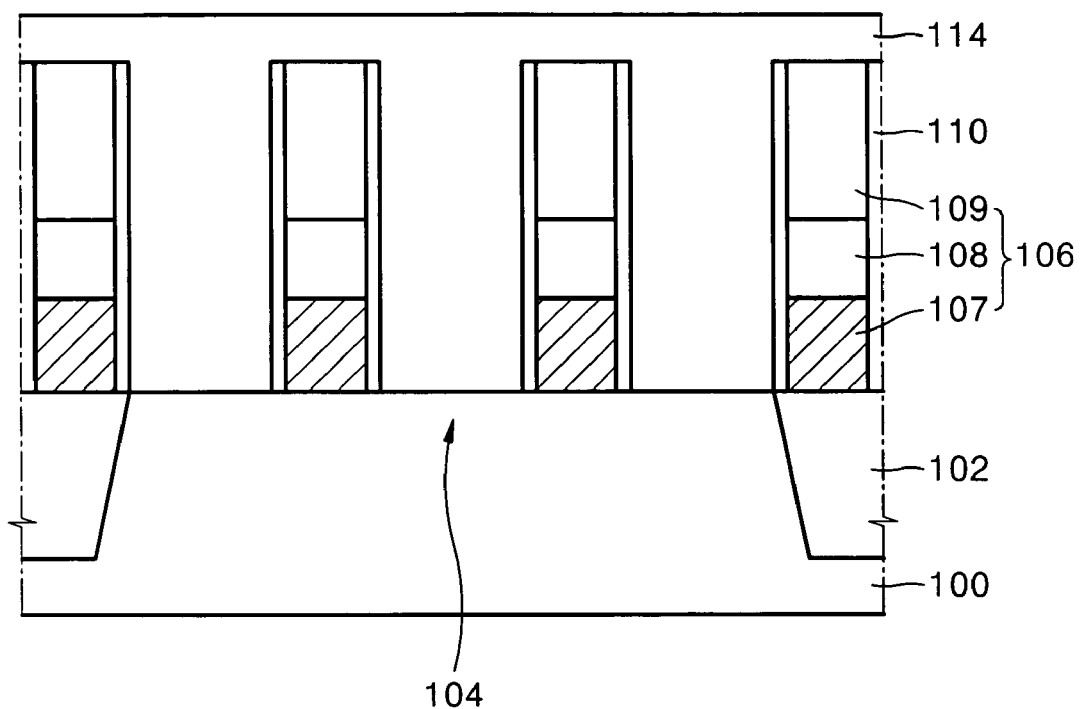
Figure 8A:
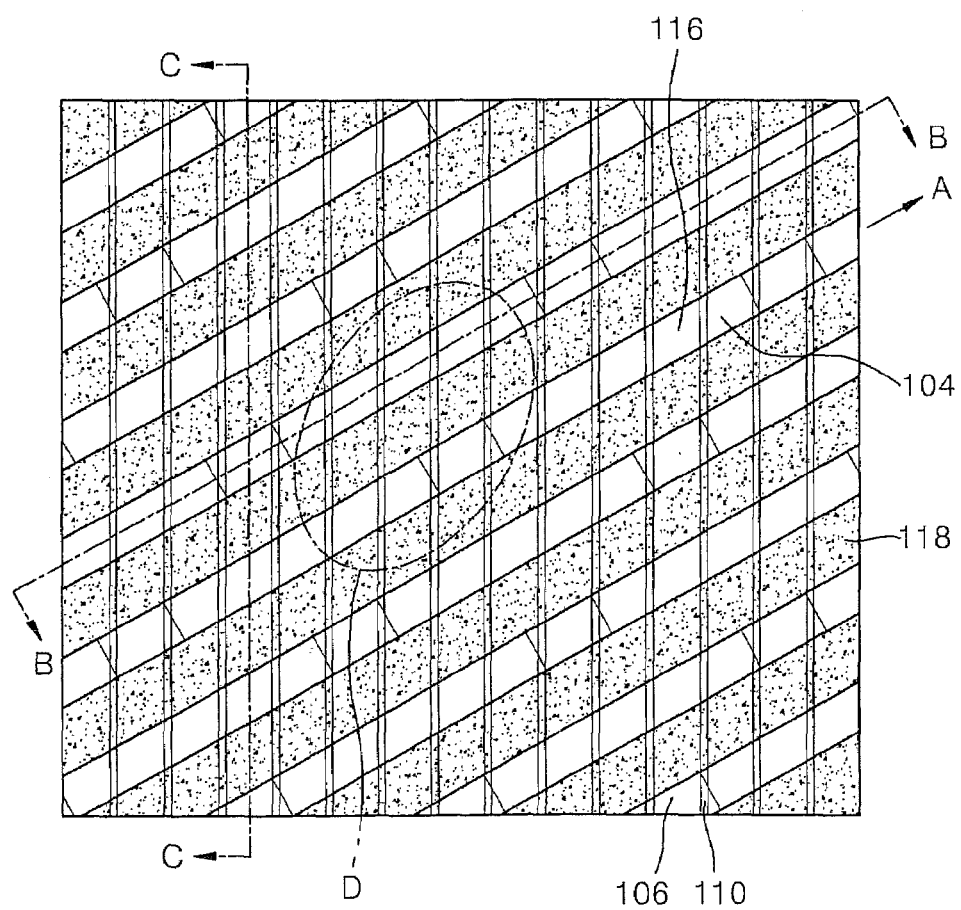
Figure 8B:
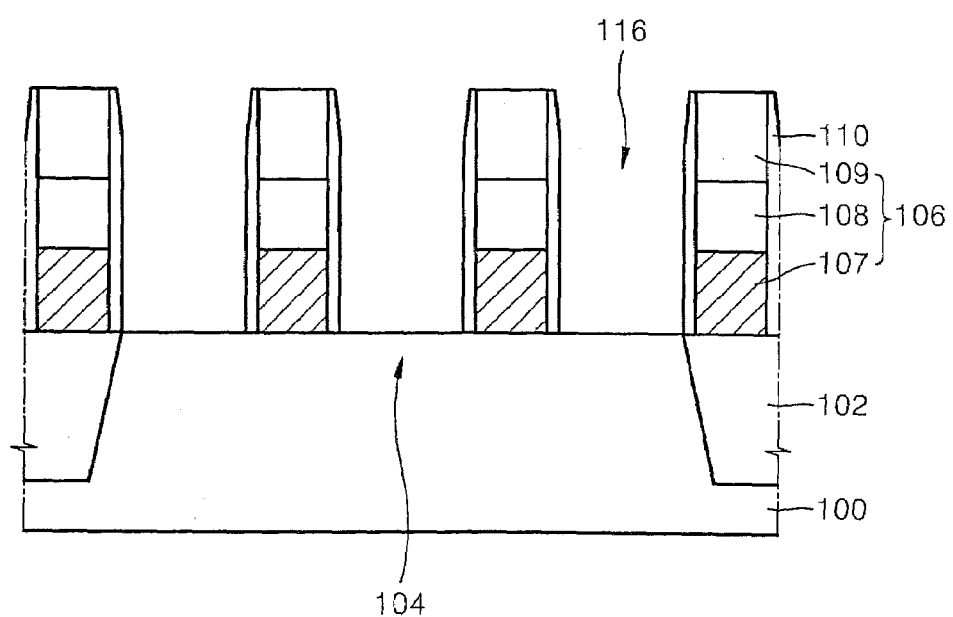
Figure 8C:
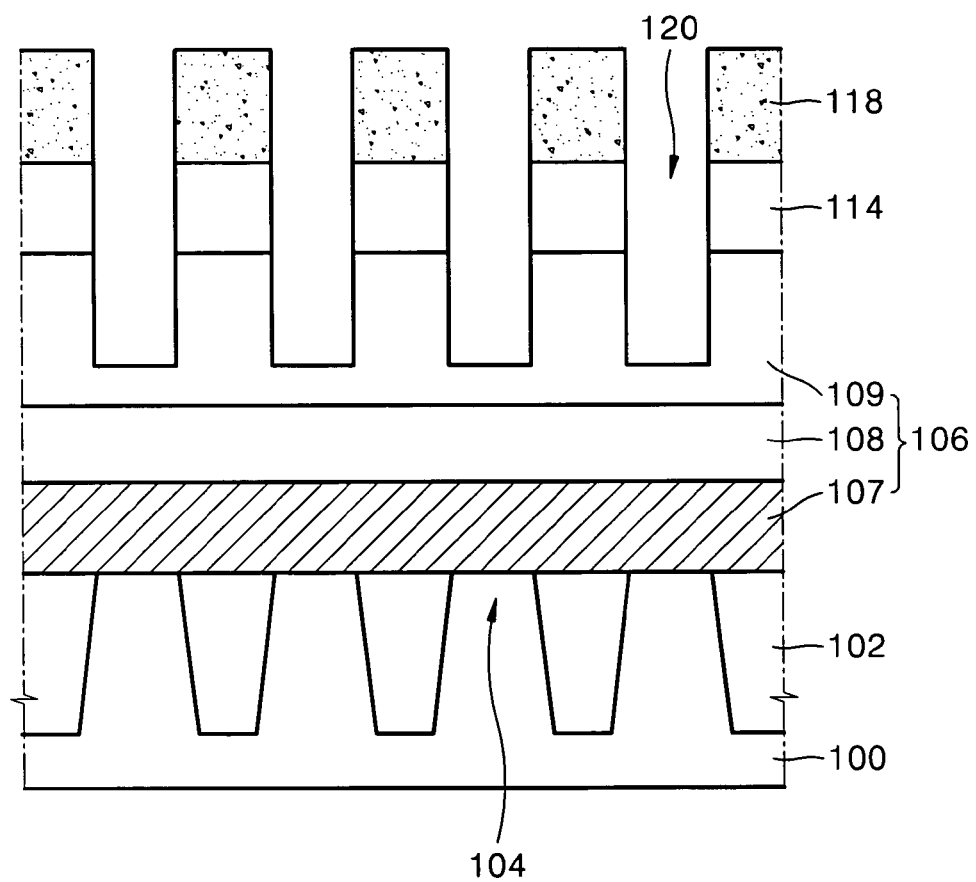
FIG. 8C is a cross-sectional view taken along a line C-C of FIG. 8A.
Figure 8D:
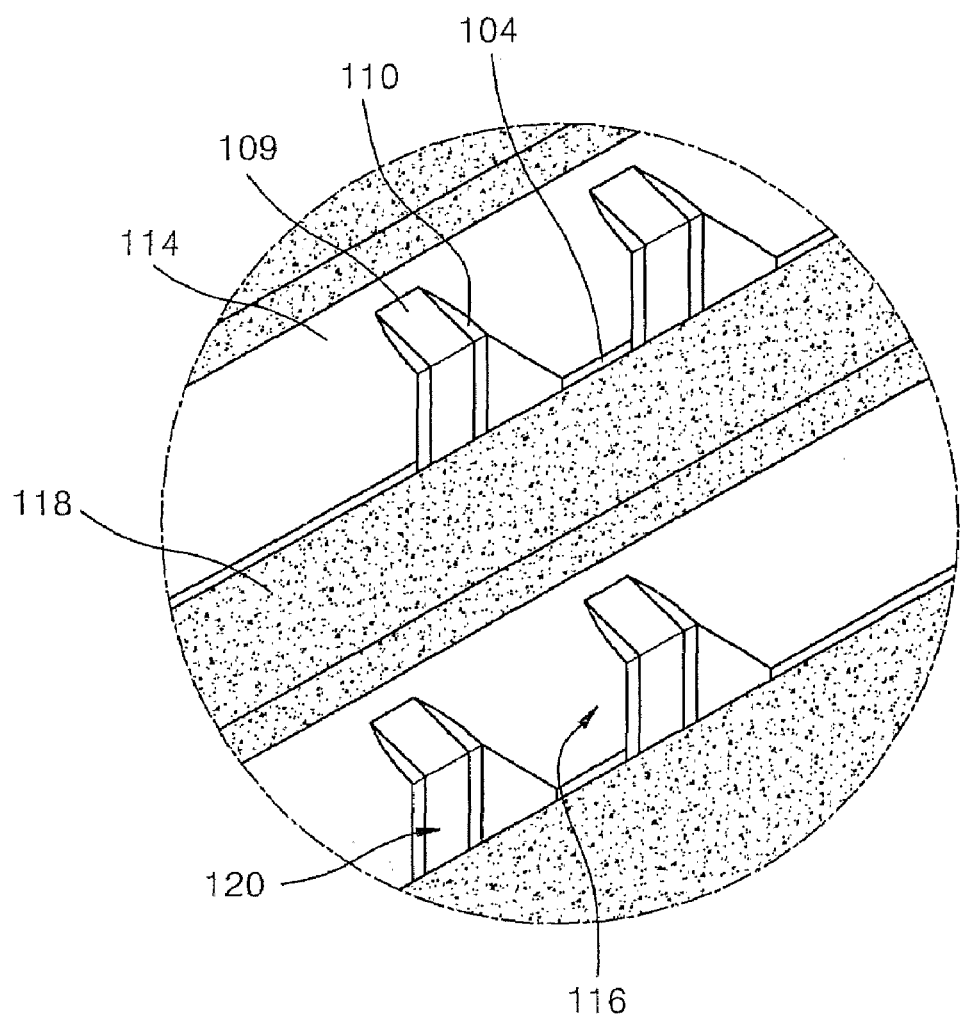
FIG. 8D is an enlarged perspective view illustrating a portion D indicated on FIG. 8A.

As illustrated in FIGS. 7A and 7B, the interlayer insulating layer 114 is then deposited over the gate lines 106 formed on the semiconductor substrate 100. The interlayer insulating layer 114 may be one or more silicon oxide layers having an appropriate etch selectivity with respect to a silicon nitride layer. An upper portion of the interlayer insulating layer 114 may then be removed to produce a planarized surface using, for example, a suitable CMP apparatus and process. As illustrated in FIG. 7B, the interlayer insulating layer 114 may be planarized without exposing any portion of the gate line 106 or an upper surface of the capping layer 109 may be exposed (not shown) with the different material providing a clear end-point for the CMP process.

As illustrated in FIGS. 8A through 8D, a photoresist layer is formed on the planarized interlayer insulating layer 114 and exposed using the openings 204 provided in photomask 200. The exposed portions of the photoresist layer are then removed to develop a photoresist pattern 118 exposing a portion of the gate line 106 and a portion of the interlayer insulating layer 114. The exposed portions of interlayer insulating layer 114 are then removed using the photoresist pattern 118 and the spacer 110 as etch masks, thereby forming contact holes 116 that expose portions of the active region 104. The interlayer insulating layer 114 may be removed using one or more etch methods, for example isotropic dry etch, anisotropic dry etch or wet etch using HF.

Figure 9A:
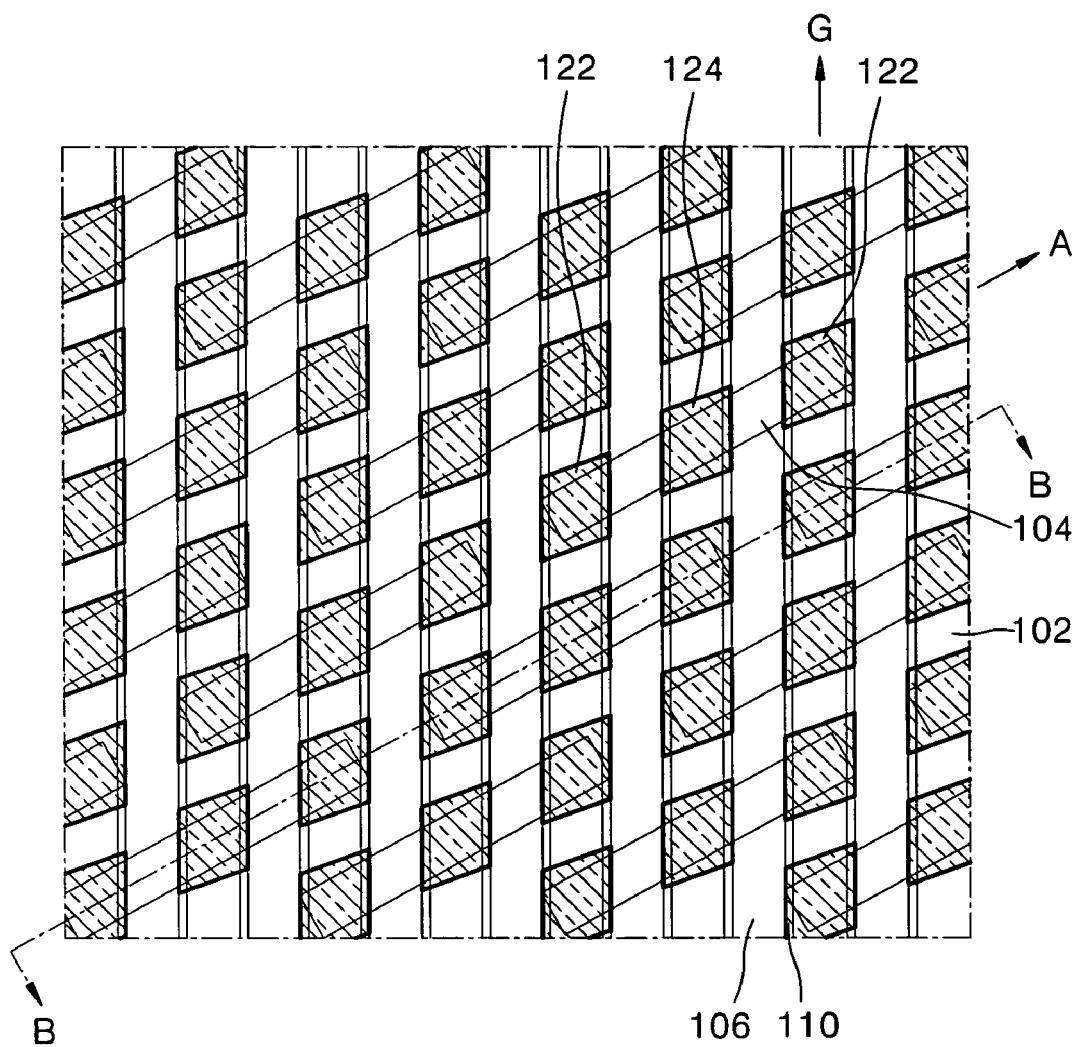
Figure 9B:
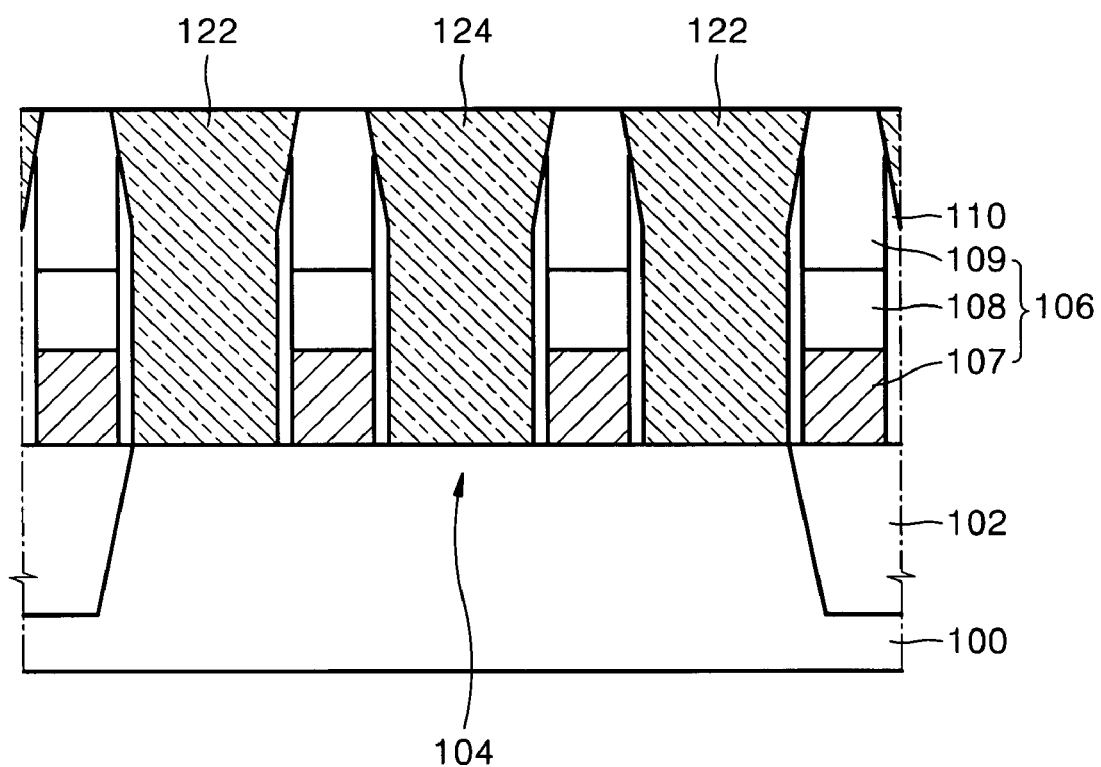

During the formation of the contact hole 116, a portion of the exposed capping layer 109 and the insulating spacers 110 may be removed to form recess regions 120. Unless addressed, the recess regions 120 may result in the formation of unwanted conductive paths during the subsequent formation of the contact plugs. As illustrated in FIGS. 9A and 9B, the photoresist pattern 118 is removed and a layer of one or more conductive materials is deposited to fill the contact holes 116 and the recess regions 120 (not shown). The conductive material layer may formed from one or more materials having both good electrical conductivity and filling properties, for example, tungsten.

An upper portion of the conductive material layer, an upper portion of the gate line 106, and an upper portion of the remaining interlayer insulating layer 114 are then removed to form a planarized surface and to separate contact plugs 122, 124 comprising the remaining portions of the conductive material layer that was formed below a plane defined by the lower surfaces of the recess regions 120. By removing sufficient material to establish the upper surfaces of the contact plugs 122, 124 below a plane defined by the lower surfaces of the recess regions 120, residual conductive material that may have remained in the recess regions 120 between the contact plugs may be removed to establish electrical isolation of adjacent conduct plugs. The contact plugs may include both bit line contact plugs 124 that may subsequently be connected to a bit line, and lower electrode contact plugs 122 that may subsequently be connected to the lower electrodes of capacitors.

The contact plugs 122, 124 are separated by the insulating layer spacer 110 formed on sidewalls of the gate line 106, and the interlayer insulating layer 114 and may have a complex polygonal shape. That is, because the shape of the contact plugs 122, 124 are defined by openings formed by etching the material exposed in the first photomask window 204, e.g., the remaining portions of the gate line 106, the insulating spacers 110 and the residual portion of the interlayer insulating layer, they may have a complex angular shape in which the upper portion is wider and/or flared at an angle relative to the lower portion of the contact plug. Depending on the degree to which an area of each of the upper portion of the contact plugs 122, 124 extends beyond the lower portion, the surface of each of the contact plugs may fully cover the portion of the active region 104 exposed between the gate lines.

In the method of forming contact plugs according to a first example embodiment of the invention, the process margin for forming the contact plugs may be increased relative to the process margin provided by a conventional hole pattern-shaped photomask window using similar photolithographic apparatus and photoresists. By increasing the process margin, semiconductor devices fabricated to more demanding design rules and/or higher degrees of integration may be processed on conventional exposure equipment, thereby avoiding the necessity of shortening the wavelength of an exposure equipment light source or increasing numerical aperture typically required for processing semiconductor devices having increased degrees of integration. In addition, methods according to the example embodiments of the invention may avoid the necessity of adding a separate hard photomask in order to remove wrinkles generated during a process of forming the contact hole 116, thereby simplifying the process and reducing the likelihood of defects.

Second Embodiment

Figure 10:
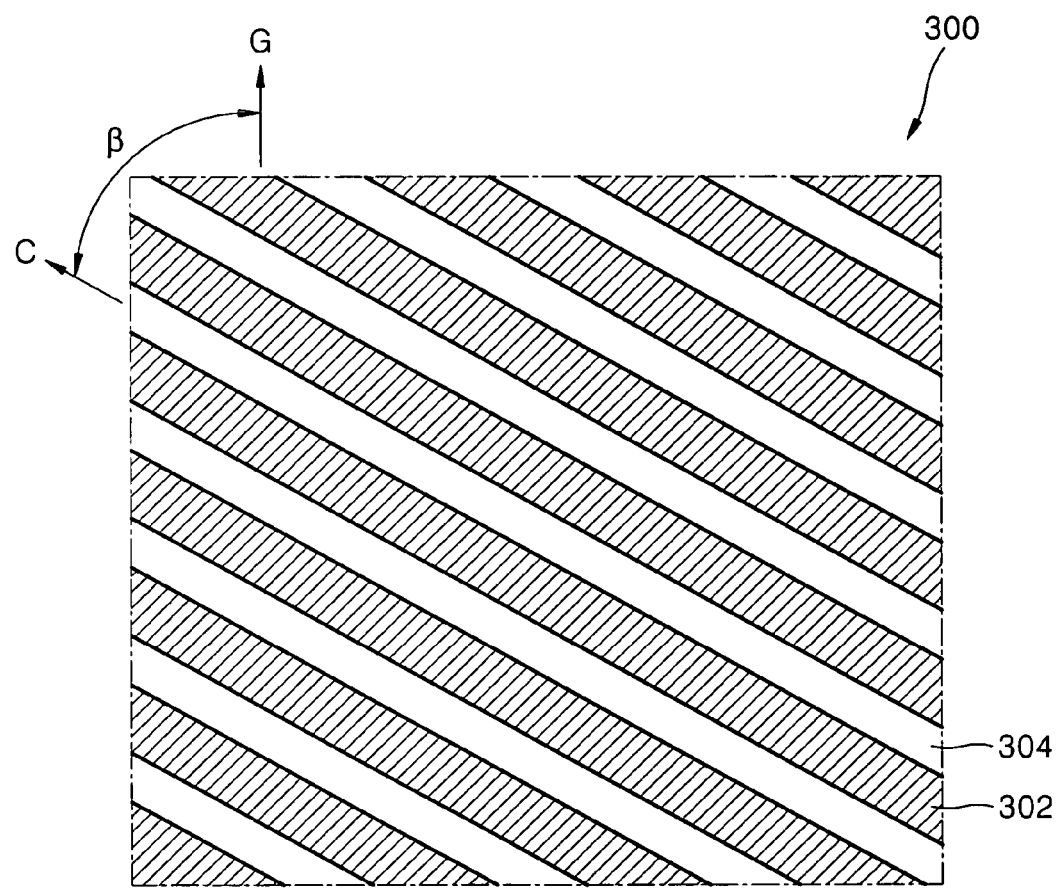
FIG. 10 is a plan view illustrating a photomask having a second photomask window according to a second example embodiment of the present invention.

FIG. 10 is a plan view illustrating a photomask 300 having a second photomask window 304 according to a second example embodiment of the invention. As illustrated in FIG. 10, the photomask 300 of the second example embodiment of the invention includes a substrate 302 for a photomask (hereinafter, referred to as "mask substrate") and a second photomask window 304 which includes a plurality of stripe-shaped transparent photomask windows arranged parallel to a third axis C extending in a direction that will form an acute angle β with axis G which parallels the orientation of the gate lines. The angle β may be symmetrical with the angle α relative to the second axis G corresponding to the orientation of the gate lines 106, but in some embodiments may also be offset relative to angle α.

Figure 11:
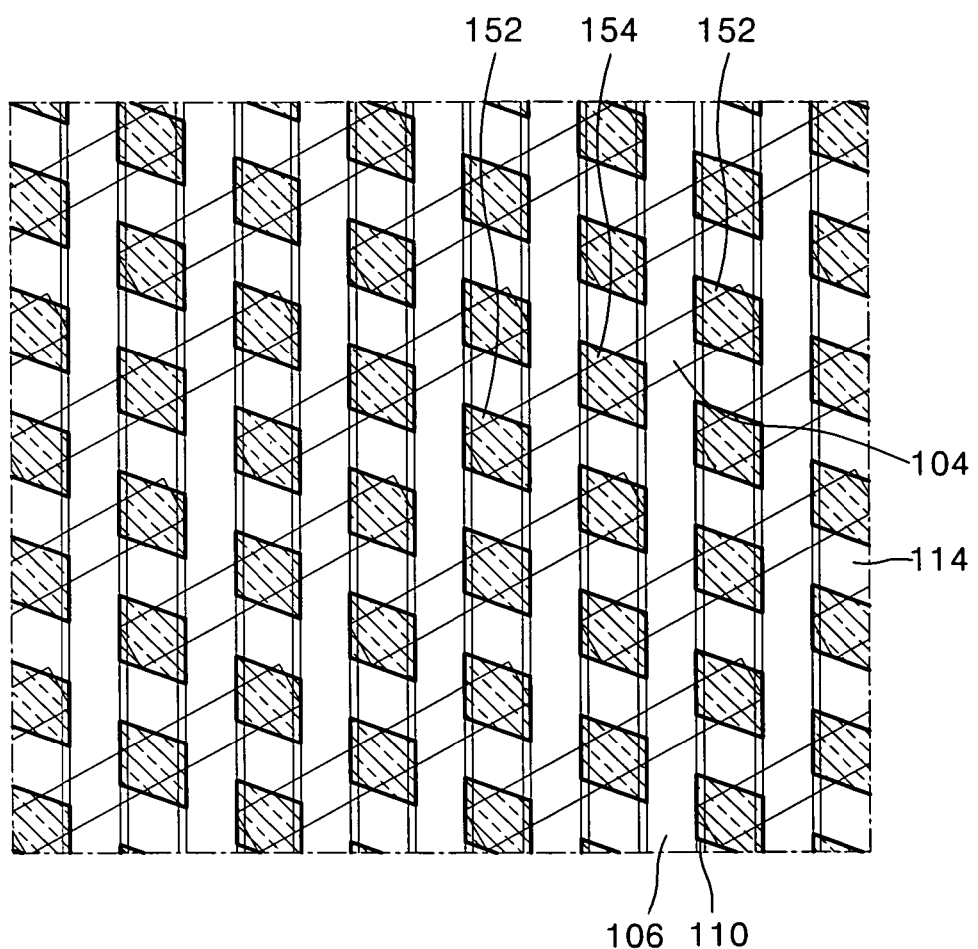
FIG. 11 is a plan view illustrating a method of forming a contact plug according to a second example embodiment of the present invention.

FIG. 11 is a plan view illustrating a method of forming a contact plug according to a second example embodiment of the invention. The process of forming a contact hole 116 according to a second example embodiment of the invention generally corresponds to that described above in connection with the first example embodiment and as illustrated in FIGS. 5A through 8D and will not, therefore, be repeated.

As illustrated in FIG. 11, contact plugs 152, 154 formed using photomask 300 cover a portion of an active region 104. The contact plugs may include both bit line contact plugs 154, that may subsequently be connected to a bit line, and lower electrode contact plugs 152, that may subsequently be connected to lower electrodes of capacitors. The contact plugs 152, 154 are separated by the remaining portions of the insulating spacers 110 formed on the sidewalls of the gate lines 106, the remaining portions of the capping layer 109, and the remaining portions of the interlayer insulating layer 114. The contact plugs 152, 154 may have a complex polygonal shape in which the upper portion is enlarged or flared relative to the lower portion.

That is, as the contact plugs 152, 154 are defined by the first photomask window 304 and the gate line 106, they may be formed to have an angular shape by the first photomask window 304 and the gate line 106. The contact plugs 152, 154 may fully cover the exposed portions of the active region 104.

In the method of forming a contact plug according to a second example embodiment of the present invention, the process margin for forming contact plugs may be increased relative to the process margin provided by a conventional hole pattern photomask. By increasing the process margin, a method according to the second example embodiment will tend to extend the utility of conventional exposure equipment for the production of semiconductor devices that are more highly integrated or are manufactured to more demanding design rules without having to decrease the wavelength of the same light source and/or increase the numerical aperture. In addition, methods according to the example embodiments of the invention may avoid the necessity of adding a separate hard photomask in order to remove wrinkles generated during a process of forming the contact hole 116, thereby simplifying the process and reducing the likelihood of defects.

However, contact plugs fabricated according to a second example embodiment of the present invention may expose a smaller portion of the active region 104 relative to that exposed in accord with the first example embodiment as a result of the change in alignment between the contact plug mask openings and the active areas. As the exposed portion of the active region 104 is reduced, the electrical characteristics of the resulting contact plugs may also be different than those achieved in accord with the first example embodiment. In particular, contact plugs fabricated in accord with the second example embodiment may exhibit different electrical characteristics, for example, with regard to parameters such as current gain, in comparison with contact plugs fabricated according to the first example embodiment. Thus, the axis or direction along which the photomask window is aligned may be utilized to provide another degree of control over the resulting electrical characteristics of the final semiconductor device.

In the example photomask layouts and the example methods of forming contact plugs using such photomask layouts according to the example embodiments of the invention as described above, the contact plugs are formed using photomask pattern that exposes substantially the entire active region, thereby increasing the process margin for forming contact plugs in comparison with the conventional hole pattern-shaped photomask window.

Further, as the process margin is increased, the usefulness of conventional exposure equipment is also extended, thereby delaying the necessity and expense of moving to exposure equipment having shorter wavelength light sources and/or increased numerical apertures in order to pattern semiconductor devices having an increased degree of integration and/or more demanding design rules. Furthermore, by adopting methods according to the example embodiments for forming contact plugs, it is not necessary to add a separate hard photomask to remove wrinkles generated during the process of forming the contact holes.

While the invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of forming contact plugs comprising:
   forming a plurality of groups of elongated active regions aligned along a longitudinal axis, each group being parallel to a first axis in a semiconductor substrate;
   forming a plurality of evenly spaced gate lines parallel to a second axis, wherein the first and second axes intersect at an acute angle α;
   forming an interlayer insulating layer between the plurality of gate lines;
   forming a plurality of evenly spaced contact opening lines parallel to a third axis exposing portions of the plurality of gate lines and portions of the interlayer insulating layer between the adjacent gate lines;
   forming contact plugs in contact with the exposed portions of the active regions between the plurality of gate lines; and
   removing an upper portion of the interlayer insulating layer to form a planarized surface, the removing of the upper portion exposing upper surfaces of the plurality of gate lines.

2. The method of forming contact plugs according to claim 1, wherein:
   the first axis and the third axis are parallel.

3. The method of forming contact plugs according to claim 1, wherein:
   the acute angle α is a first acute angle α; and
   the third axis and the second axis intersect to form a second acute angle β, wherein the first axis and the third axis are not parallel.

4. The method of forming contact plugs according to claim 3, wherein:
   the first acute angle α and the second acute angle β satisfy the relationship α=β.

5. A method of forming contact plugs comprising:
   forming a plurality of groups of elongated active regions aligned along a longitudinal axis, each group being parallel to a first axis in a semiconductor substrate;
   forming a plurality of evenly spaced gate lines parallel to a second axis, wherein the first and second axes intersect at an acute angle α;

forming an insulating spacer on each sidewall of the plurality of gate lines;

forming an interlayer insulating layer between the plurality of gate lines;

removing an upper portion of the interlayer insulating layer to form a planarized surface;

forming a plurality of evenly spaced contact opening lines parallel to a third axis exposing portions of the plurality of gate lines and portions of the interlayer insulating layer between the adjacent gate lines on the planarized surface;

etching the exposed portions of the plurality of gate lines at a first etch rate $R_1$ and etching the exposed portions of the interlayer insulating layer at a second etch rate $R_2$ to form contact openings and expose portions of the active regions, wherein the first and second etch rates satisfy the expression $R_1 < R_2$;

forming contact plugs in contact with the exposed portions of the active regions between the plurality of gate lines; and removing an upper portion of the interlayer insulating layer to form a planarized surface, the removing of the upper portion exposing upper surfaces of the plurality of gate lines.

6. The method of forming contact plugs according to claim 5, wherein:

the contact plugs each have a complex shape in which an upper portion is wider than a lower portion and has a tapered profile from the lower portion to an upper surface of each contact plug.

7. The method of forming contact plugs according to claim 5, wherein:

the first axis and the third axis are parallel.

8. The method of forming contact plugs according to claim 5, wherein:

the acute angle $\alpha$ is a first acute angle $\alpha$; and the third axis and the second axis intersect to form a second acute angle $\beta$, wherein the first axis and the third axis are not parallel.

9. The method of forming contact plugs according to claim 8, wherein:

the first acute angle $\alpha$ and the second acute angle $\beta$ satisfy the relationship $\alpha=\beta$.

10. The method of forming contact plugs according to claim 5, wherein forming the contact plugs further comprises:

depositing a layer of a conductive material sufficient to fill the contact openings; and removing an upper portion of the layer of conductive material to isolate portions of the conductive material within the contact openings and thereby form contact plugs.

11. The method of forming contact plugs according to claim 10, wherein:

etching the exposed portions of the plurality of gate lines to form recessed regions having lower surfaces; and the upper portion of the layer of conductive material is removed to form upper surfaces of the contact plugs that are below a plane defined by the lower surfaces of the recessed regions.

* * * * *